US008374355B2

(12) United States Patent
LaRoche et al.

(10) Patent No.: US 8,374,355 B2
(45) Date of Patent: Feb. 12, 2013

(54) ROBUST AND EFFICIENT FREQUENCY-DOMAIN DECORRELATION METHOD

(75) Inventors: Jean LaRoche, Santa Cruz, CA (US); Michael M. Goodwin, Scotts Valley, CA (US)

(73) Assignee: Creative Technology Ltd., Singapore (SG)

( * ) Notice: Subject to any disclaimer, the term of this patent is extended or adjusted under 35 U.S.C. 154(b) by 1283 days.

(21) Appl. No.: 12/099,075

(22) Filed: Apr. 7, 2008

(65) Prior Publication Data

US 2008/0247558 A1 Oct. 9, 2008

Related U.S. Application Data

(60) Provisional application No. 60/910,449, filed on Apr. 5, 2007.

(51) Int. Cl.
*H04B 3/20* (2006.01)
*H03G 3/00* (2006.01)
*H04M 9/08* (2006.01)

(52) U.S. Cl. ........................ 381/66; 381/63; 379/406.14

(58) Field of Classification Search .................... 381/63, 381/66; 379/406.14

See application file for complete search history.

(56) References Cited

U.S. PATENT DOCUMENTS 6,700,388 B1 * 3/2004 Mayor et al. .................. 324/537
2003/0185147 A1 * 10/2003 Taga et al. ..................... 370/210

* cited by examiner

*Primary Examiner* — Matthew Landau
*Assistant Examiner* — Khaja Ahmad
(74) *Attorney, Agent, or Firm* — Creative Technology Ltd.

(57) ABSTRACT

An audio signal is processed by transforming the signal into a frequency domain representation having a plurality of frequency subbands. A decorrelated signal is derived from the frequency domain representation using a phase rotation.

12 Claims, 5 Drawing Sheets

ROBUST AND EFFICIENT FREQUENCY-DOMAIN DECORRELATION METHOD

CROSS-REFERENCE TO RELATED APPLICATIONS

This application claims priority to and the benefit of the disclosure of U.S. Provisional Patent Application Ser. No. 60/910,449, filed on Apr. 5, 2007, and entitled "Robust and Efficient Frequency-Domain Decorrelation Method", the specification of which is incorporated herein by reference in its entirety.

BACKGROUND OF THE INVENTION

1. Field of the Invention

The present invention relates to audio signal processing techniques. More particularly, the present invention relates to methods for decorrelating audio signals.

2. Description of the Related Art

In many audio processing applications, including synthetic reverberation, ambience rendering for upmix, and multichannel acoustic echo cancellation, it is necessary to reduce the cross-correlations of a set of audio signals to achieve the desired performance. Time-domain methods for decorrelation are computationally complex and involve a high resource cost. Many audio processing algorithms operate on frequency-domain signal representations. It would be desirable to provide a computationally efficient method for decorrelation that could be used in conjunction with other processing that is being carried out in the frequency domain.

SUMMARY OF THE INVENTION

In many audio processing applications, including synthetic reverberation, ambience rendering for upmix, and multichannel acoustic echo cancellation, it is necessary to reduce the cross-correlations of a set of audio signals to achieve the desired performance. Embodiments of the present invention provide frequency-domain methods for reducing the cross-correlation of a set of audio signals to achieve the desired performance. A frequency-domain decorrelation algorithm is provided that when used in conjunction with other frequency-domain processing techniques increases computational efficiency and enables modular processing. The frequency-domain decorrelation method is based on phase modification. In one embodiment, the decorrelation process is tunable such that a multiplicity of uncorrelated signals can be generated from a single source signal.

In accordance with one embodiment, a method for decorrelating a frequency-domain representation of a signal is provided. An audio signal is received. A frequency-domain representation of the signal is then generated. An ideal or optimized frequency-domain decorrelating filter response is determined. A windowed time-domain impulse response is determined from the said ideal frequency-domain filter response. Next, a frequency-domain representation of the windowed time-domain impulse response is derived. Then a decorrelated signal is determined by multiplying the frequency-domain representation of the signal by the frequency-domain representation of the windowed time-domain impulse response.

According to another embodiment, a method for decorrelating a frequency-domain representation of a signal is provided. An audio signal is received. A frequency-domain representation of the signal is then generated. A decorrelated signal is determined from the frequency-domain representation using a phase rotation.

These and other features and advantages of the present invention are described below with reference to the drawings.

DETAILED DESCRIPTION OF PREFERRED EMBODIMENTS

Figure 1:
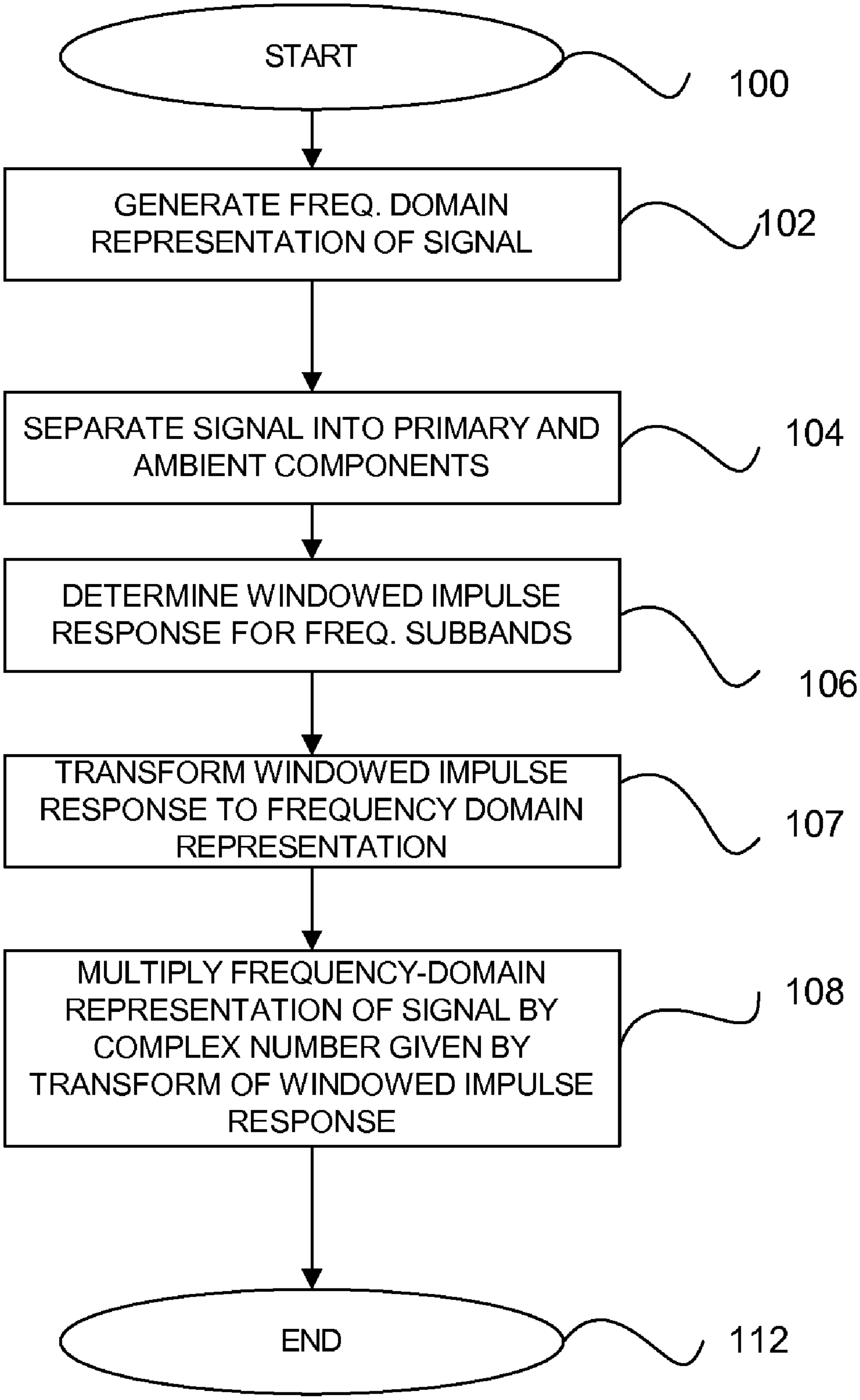
FIG. 1 is a flowchart illustrating a method of decorrelating a frequency-domain signal in accordance with one embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits its incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting as to the scope of the invention but merely illustrative.

The present invention provides a frequency-domain technique to generate a decorrelated version of a given signal, with the same magnitude spectrum. In the context of spatial audio processing, there is often a need to "duplicate" a signal such that the duplicate version is decorrelated from the original. For example, when using a primary-ambient approach to upmix a multichannel audio signal in a 5.1 format for playback over a 7.1 loudspeaker layout, the ambience components of the signal needs to be sent to two additional speakers (the side speakers). Sending the original back signals to the additional side speakers (and to the back speakers) is not acceptable because the listener will quickly notice the correlation between the side-left and back-left signals, for example; in this case, the "stereo image" will be very narrow, right in the middle of the two speakers, when what is indeed desired for the ambience rendering is a wide spatial image. To avoid this image narrowing and create a sense of envelopment, it is necessary to generate a signal that is as close to the original signal as possible (from a spectral magnitude point of view) but is decorrelated from it (to give the listener a sense of spatial envelopment). The present invention presents a technique for achieving such magnitude-preserving decorrelation based on a frequency-domain decomposition of the signal. Note that it is of interest to realize a decorrelation algorithm in the frequency domain since in many applications the signal in need of duplication is indeed generated in the frequency domain; if prior and/or subsequent processing is to be carried out in the frequency domain, it is computationally and architecturally beneficial to implement the decorrelation in the frequency domain as well.

Decorrelation Fundamentals

In this section, we describe the mathematical background of the present invention. We denote the original signal by x(n), and a "decorrelated copy" of it by y(n). Mathematically, we define the two signals x(n) and y(n) as being decorrelated if $$E[x(n)y(m)]=0\forall n,\forall m \tag{1}$$

where E(x(n)) is the expectation of signal x(n). For real-world signals, the expectation operator can be replaced by a time-domain summation:

$$E'[x(n)y(m)] = \sum_{i=-\infty}^{\infty} x(n+i)y(m+i) \tag{2}$$

and the two signals are deemed decorrelated if E'(x(n)y(m))=0 for all n and m.

More generally, the correlation between the two signals can be measured as the following ratio:

$$C_{xy} = \max_{n,m} \frac{E'[x(n)y(m)]}{\sqrt{E'[x(n)^2]E'[y(m)^2]}} \tag{3}$$

which has the advantage of being normalized with respect to signal magnitudes and is always less than 1 (according to the Cauchy-Schwartz inequality).

There is not a strict connection between the mathematical measurement of correlation and our perceptual sense of how "decorrelated" two audio signals are, or how "spread out" they sound when played over two loudspeakers. However, it seems that a larger decorrelation (i.e., a correlation that is close to 0) yields a better perceived diffusion or "spread", whereas two signals that are highly correlated (cross-correlation close to 1) will be perceived more as a point source located somewhere between the two speakers.

It will be useful in the derivation of the new decorrelation technique to consider the correlation between the input and output of a linear filter. If signal y(n) is obtained from signal x(n) by a linear filtering operation (i.e., signal x(n) is convolved with a filter impulse response h(n) to generate y(n)), if x(n) is statistically "white" (x(n) is a signal whose magnitude spectrum is flat) and of variance 1, and if x(n) is a stationary signal, it is a well known result that the cross-correlation between the two signals at lag k is equal to the impulse response of the filter h(n) at index k:

$$E[x(n)y(n+k)]=h(k)\forall k \tag{4}$$

In this case, the ratio in Eq. (3) becomes:

$$C_{xy} = \max_{n} \frac{h(n)}{\sqrt{\sum_m h(m)^2}} = \frac{1}{\sqrt{\sum_m h(m)^2}} \max_n h(n) \tag{5}$$

since $$E'[y(n)^2] = \sum_m h(m)^2.$$

Equation (5) indicates that the input and output signals will be decorrelated from each other if the filter's $L^\infty$ norm is small with respect to its $L^2$ norm.

There are two techniques known to those of skill in the art for creating a decorrelated version of a signal in the time domain: using allpass filters and using a reverberator. The following section presents methods for implementing decorrelation in the frequency domain in accordance with embodiments of the present invention.

Frequency-Domain Decorrelation

Implementing a decorrelation process in the frequency domain in accordance with embodiments of the present invention provides several potential advantages. Architectural advantages are potentially provided if some other parts of the signal processing chain are implemented in the frequency domain (for example, ambience extraction), because a frequency-domain decorrelation algorithm alleviates the need to transform the signal back to the time domain before further processing (a design simplicity advantage). In some cases the frequency-domain description of the signal enables a more satisfactory decorrelation than would be possible in the time-domain—and in at least some instances at a lower computation cost.

In some embodiments, the problem at hand is addressed by designing an allpass filter h(n) whose $L^\infty$ norm is as small as possible (i.e., the maximum absolute value of the impulse response is as small as possible). This can be restated as minimizing the peak-to-RMS ratio of the impulse response, which is a well studied problem. In addition, because we operate in the frequency domain, the impulse response cannot be arbitrarily long if a simple frequency-domain complex multiplication is to be used to implement the decorrelator (i.e., if the DFT of signal y(n) is obtained from the DFT of signal x(n) via a bin-wise complex multiplication, where the term "DFT" refers to the discrete Fourier transform). This is because in order to avoid time-aliasing during frequency-domain convolution, the length of the DFT must be larger than the sum of the lengths of the input signal and the impulse response. Note that long impulse responses can be implemented by using filtering in the DFT subbands (instead of a single complex multiplication), but that adds to the complexity of the algorithm. In practice, some amount of time-domain aliasing is inaudible and can be allowed—at the benefit of reducing the computational resource load of the processing.

FIG. 1 is a flowchart illustrating a method of decorrelating a frequency domain signal in accordance with one embodiment of the present invention.

The method commences at operation 100. Initially, at operation 102, a frequency-domain representation of the signal is generated. The frequency-domain representation may be generated by any method known in the art, including but not limited to the use of the Fast Fourier Transform (FFT), which is an efficient algorithm for computing the discrete Fourier transform (DFT). In a preferred embodiment for an upmixing application, the signal is separated into primary and ambient components at operation 104. In other embodiments, no primary-ambient separation occurs. That is, decorrelation is performed in some embodiments without a decomposition of the frequency-domain representation.

Next, at operation 106 the windowed impulse response of a time-domain decorrelator is determined. At operation 107, the windowed impulse response is converted to a frequency-domain representation which comprises the phase and/or magnitude to be used in the subsequent complex multiplication. At operation 108, the frequency-domain representation of the signal (see operation 102) is multiplied by the complex numbers given by the transform of the windowed impulse response; a complex multiplication is carried out on each bin of the frequency-domain signal representation. In a preferred embodiment, the decorrelating filter is designed based on unequal subbands; the use of unequal subbands in the design is independent of this multiplicative process, which in such embodiments is likewise carried out on each bin of the frequency-domain signal representation. The method concludes at operation 112.

Figure 2:
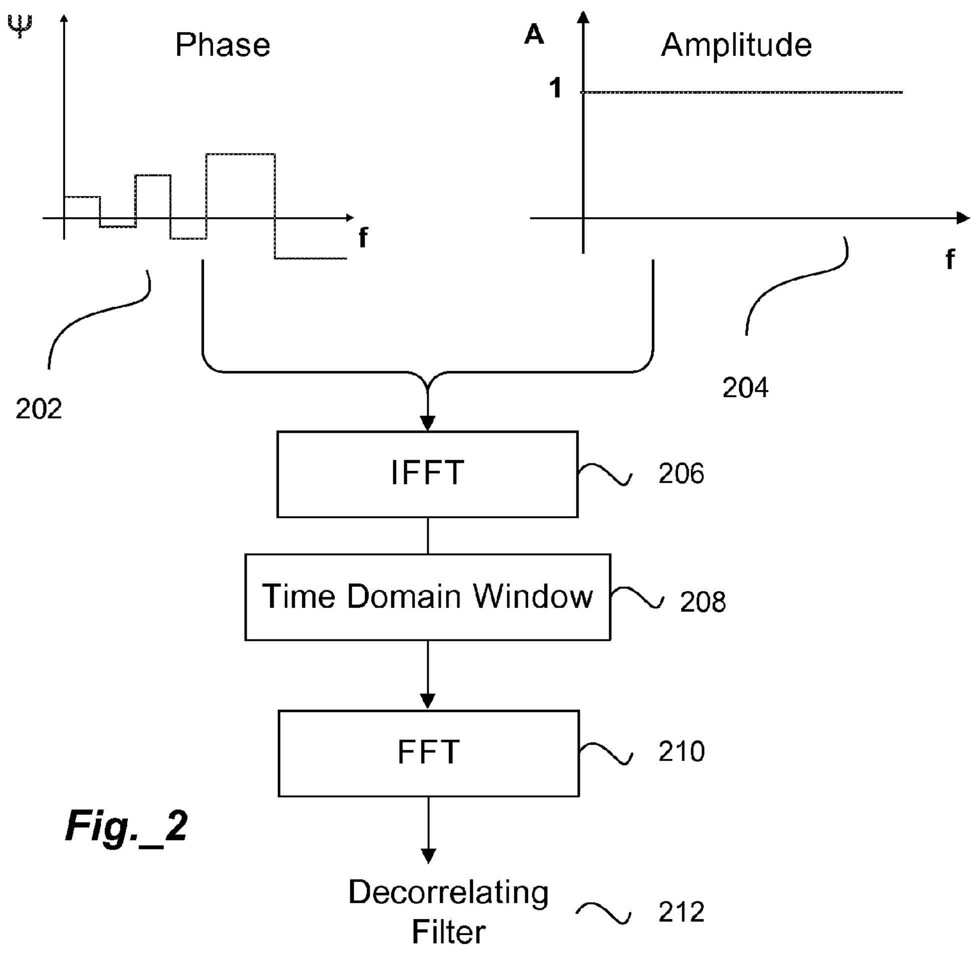
FIG. 2 is a flowchart illustrating how the decorrelation filter is computed.

FIG. 2 is a flowchart illustrating how the decorrelation filter is computed. Initially, the frequency domain information for the subband includes the phase 202 and magnitude 204. Through the use of an inverse transform 206 and the application of a windowing function 208 to the resulting time-domain signal, a windowed impulse response is generated. Next, the windowed impulse response is converted to a frequency-domain representation, for example through the use of an FFT 210. This representation comprises the phase and magnitude information to be used in a subsequent complex multiplication, i.e., the decorrelating filter 212.

Figure 5:
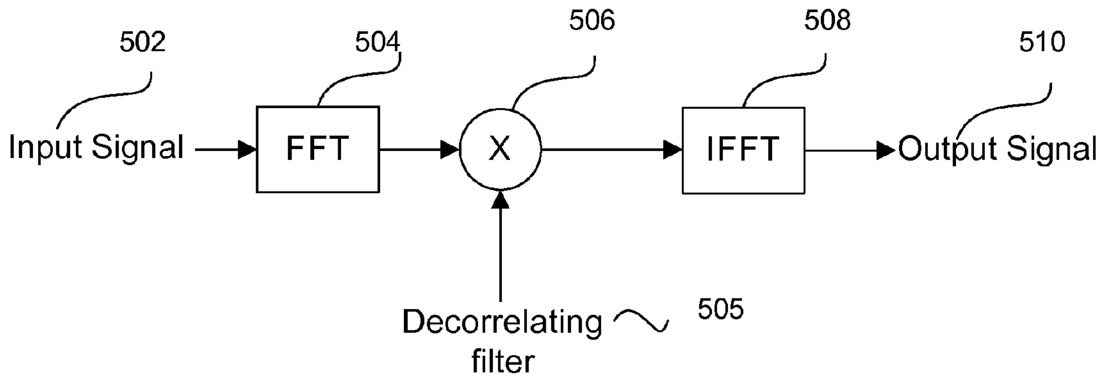
FIG. 5 shows a flow diagram of an overview of the decorrelating process in accordance with one embodiment of the present invention.

FIG. 5 shows a flow diagram of an overview of the decorrelating process in accordance with one embodiment of the present invention. Initially, the input signal 502 is transformed to a frequency domain representation through the use of an appropriate transform, for example an FFT 504. Next, the decorrelation filter 505 (such as including an allpass filter designed with the guidance provided by this specification) filters the frequency-domain signal, for example by complex multiplication. Next the filtered signal is transformed back to the time domain through the use of a suitable inverse transform, for example an inverse Fast Fourier Transform. Finally, the filtered output signal 510 is provided. For online signal processing, a conventional short-term Fourier Transform is more suitable: the input signal is segmented into overlapping frames by means of an analysis window, each input frame is processed as shown in FIG. 5 creating a series of output frames. The output frames are then windowed and overlapped to create the output signal.

Those of skill in the art will understand that the precedence effect can decrease the sense of spatial envelopment. In accordance with embodiments of the present invention, the decorrelation filter is designed so as to minimize the group delay such that the precedence effect is not detrimental to the spatial percept. To minimize the group delay so that the precedence effect is not detrimental, the phase response of the decorrelation filter is preferably as flat as possible, or at least as locally flat as possible. In one embodiment, a phase response that is piecewise constant is used. As a building block, consider a frequency band centered around frequency $f_k$, of width $\Delta k$, and let the filter's frequency response $H_k(f)$ have a phase $\alpha_k$ in that band (with a magnitude of 1) and be 0 outside of that band:

$$H_k(f) = \begin{cases} e^{j\alpha_k} & \text{for } |f - f_k| < \Delta_k \\ 0 & \text{otherwise} \end{cases} \tag{6}$$

The next step in the design is to select $\alpha_k$ and $f_k$ for each band, where the $f_k$ are chosen such that the band edges are adjacent. The overall response of a filter constructed from such single-band building blocks is then given by the sum of all the single-band responses:

$$H(f) = \sum_k H_k(f). \tag{7}$$

The group delay will be 0 over each band, and will be undefined at the band boundaries (because of the phase discontinuity at band boundaries).

It is straightforward to compute the time-domain impulse response of the single-band filter specified in Eq. (6); using the definition of the inverse Fourier transform directly yields $$h_k(n) = \frac{1}{\pi n}[\sin(\alpha_k + 2\pi n(f_k + \Delta_k)) - \sin(\alpha_k + 2\pi n(f_k - \Delta_k))] \tag{8}$$

or, more simply:

$$h_k(n) = \frac{2}{\pi n}[\sin(\pi n \Delta_k)\cos(\alpha_k + 2\pi n f_k)]. \tag{9}$$

The response shows an envelope term ($2\sin(\pi n \Delta_k)/\pi n$) which is akin to a sinc function and is related to the bandpass nature of the response, and a modulation term $\cos(\alpha_k + 2\pi n f_k)$ given by the phase and center frequency of the band. A few conclusions can be drawn from this formula:

- The impulse response of each single-band filter is not time-limited, since it has a sinc amplitude envelope. This is sometimes an issue since our frequency-domain implementation ideally calls for a time-limited impulse response to avoid time-domain aliasing, but it is not normally problematic since the time-domain aliasing is inaudible for good designs.
- It will be beneficial to select different bandwidths $\Delta_k$ for each single-band filter so as to avoid a common envelope term $2\sin(\pi n \Delta_k)/\pi n$; otherwise, the overall impulse response will exhibit "holes" at time samples where $\pi n \Delta_k$ is close to a multiple of $\pi$.

Practical Implementation

In one embodiment, using the idea above (namely that of constructing a decorrelation filter from subband building blocks) in a practical implementation, the infinite length impulse response is truncated so that the decorrelation filtering can be implemented by a simple complex multiplication in the frequency domain without incurring time-domain aliasing artifacts. In one embodiment, the impulse response is windowed, using for example a Hanning window. Those of skill in the art will appreciate in light of the guidance provided by this specification that the invention embodiments are not limited to the use of the particular window but that any suitable window may be used. The result of the windowing operation is that the filter's phase response will not be identical to our ideal staircase curve, and the magnitude response will not be equal to 1 at all frequencies. FIG. 3 shows a design example; the phase is given in FIG. 3B along with the resulting impulse response (FIG. 3A).

Figure 3A:
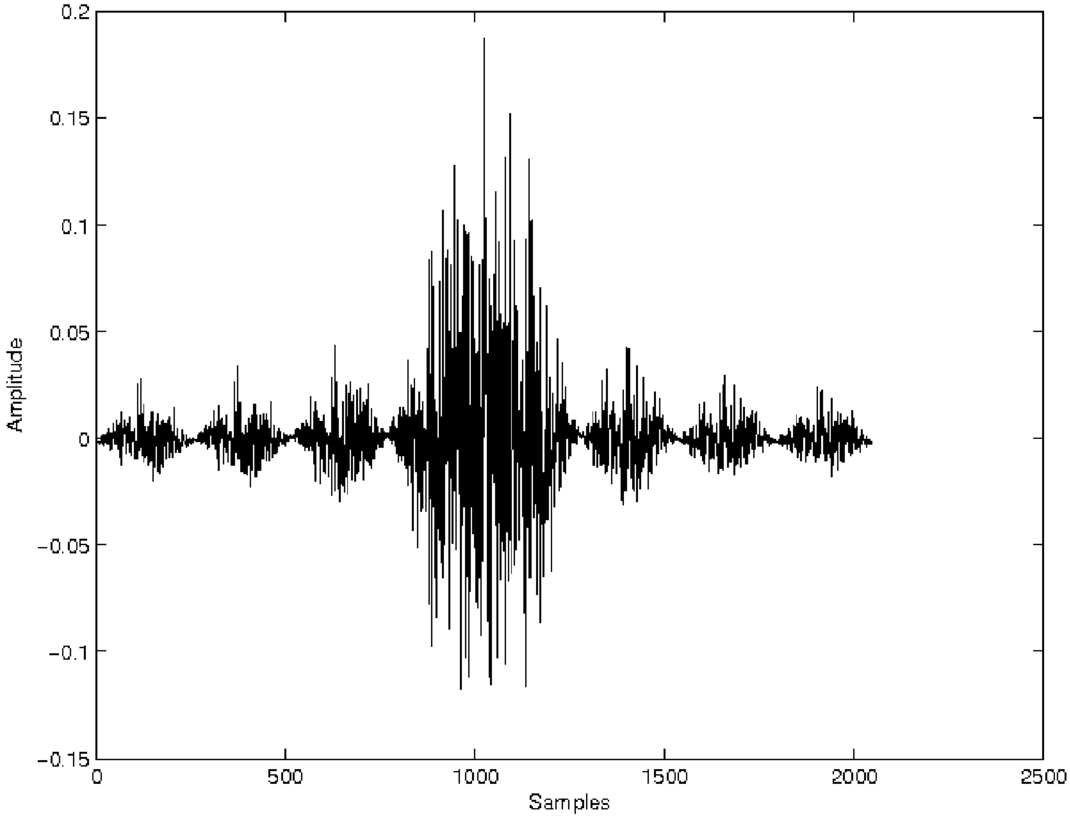
FIG. 3 shows the phase response and the corresponding impulse response in accordance with one embodiment of the present invention.
Figure 3B:
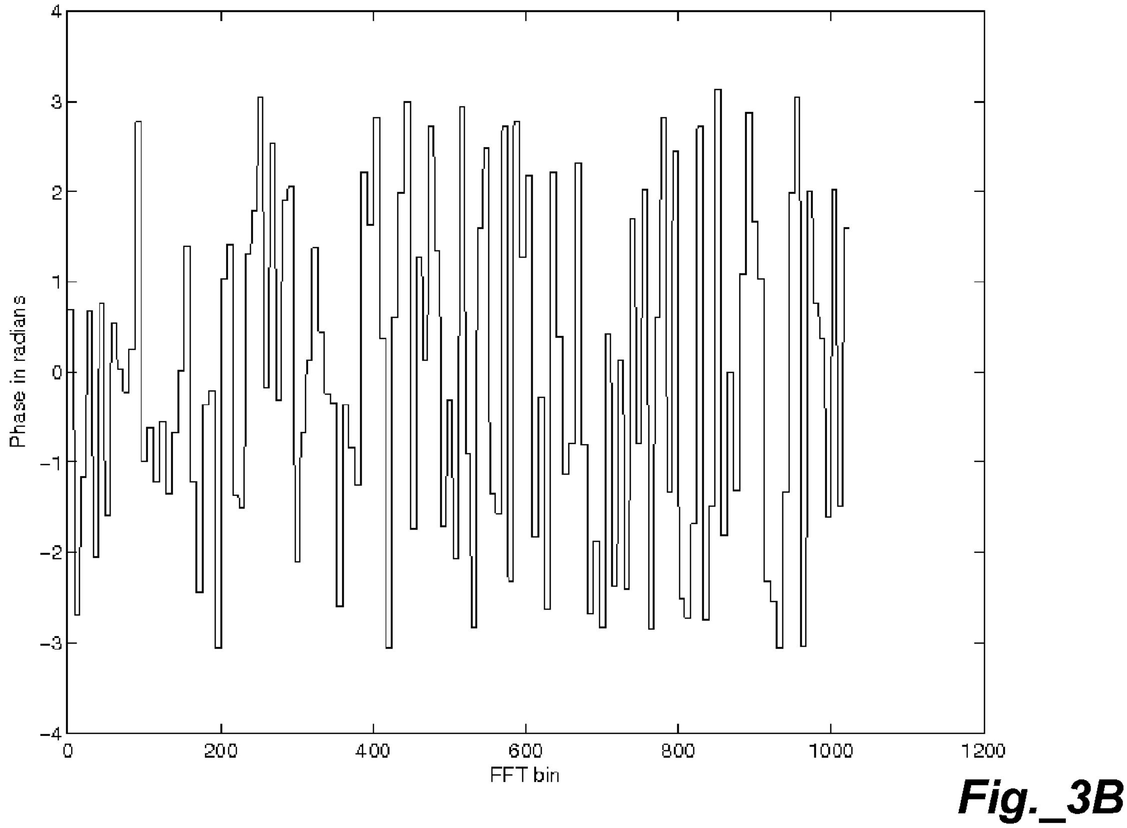

That is, a piecewise constant phase of an allpass filter is shown in FIG. 3B and the corresponding impulse response is illustrated in FIG. 3A.

Figure 4A:
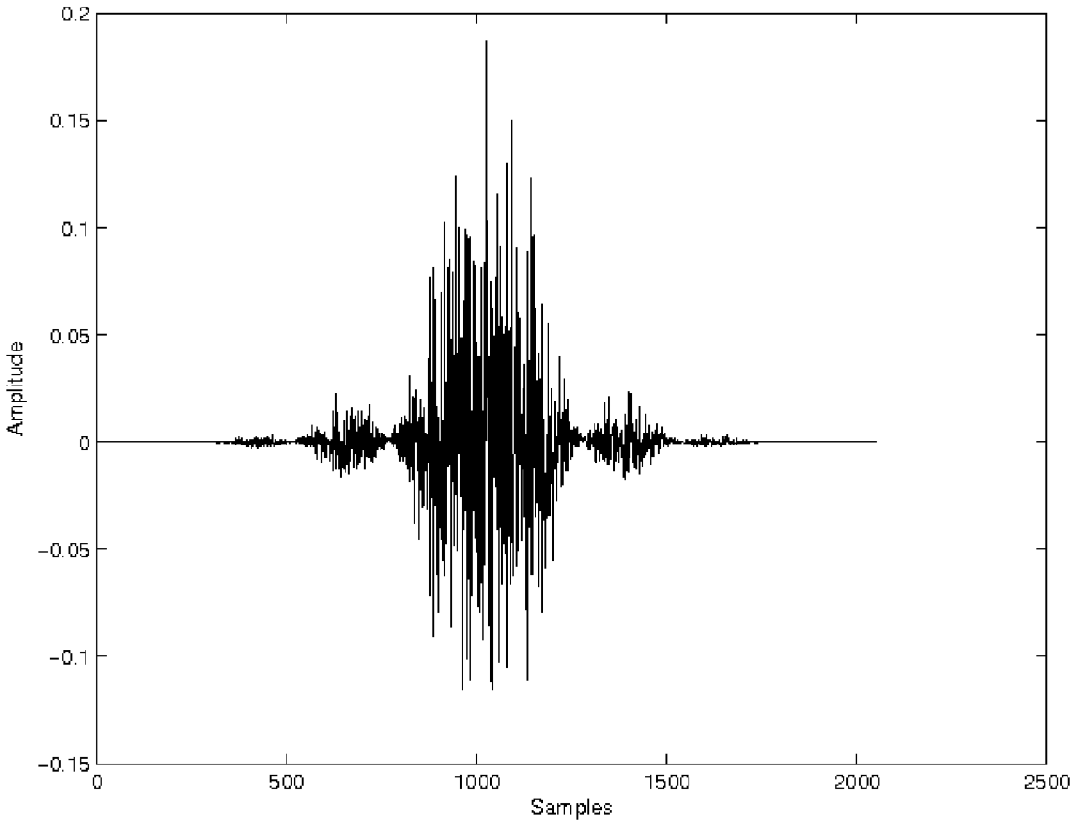
FIG. 4 shows the windowed impulse response and the corresponding magnitude response in accordance with one embodiment of the present invention.
Figure 4B:
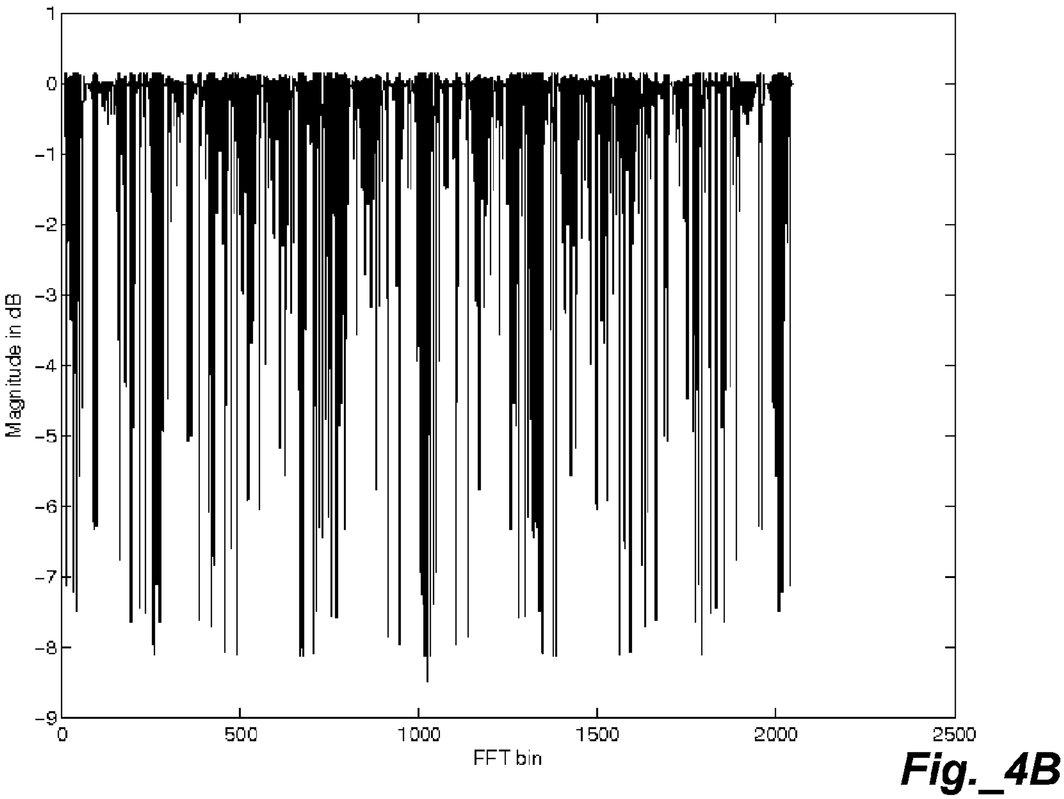

Because a discrete Fourier transform (DFT) was used to compute the impulse response in the example of FIG. 3, the impulse response is already "time aliased". To obtain an impulse response closer to the inverse discrete-time Fourier transform (DTFT), in one embodiment the DFT is oversampled. Those of skill in the art will understand the distinction between the DFT and the DTFT and the benefit of oversampling in this process. FIG. 4 shows the impulse response multiplied by a weighting window in FIG. 4A and the corresponding magnitude response in FIG. 4B.

As expected, the windowing operation affects the magnitude response; it is no longer a constant 0 dB. The impulse response, however, is now short enough in duration to be implemented via a complex multiplication in the frequency domain without incurring time-domain aliasing artifacts (provided that the length of the DFT is large enough).

Implementation Options

The section above described the preferred implementation embodiment of the current invention, in which windowing the infinite-duration impulse response corresponding to the piecewise-constant phase characteristic yields a filter that can be implemented in the frequency domain by a complex multiplication for each bin. In this approach, each DFT bin in the frequency-domain representation of the input signal x(n) must be multiplied by a complex number given by the DFT of the windowed impulse response at that same bin. In another embodiment, the approach is simplified by using only the phase of the DFT of the windowed impulse response. Then, each bin of the signal's DFT is modified in phase only; in a real-imaginary frequency-domain representation, this still corresponds to a complex multiplication, but in a magnitude-phase representation (which is used in other processing modules that might be used in conjunction with the decorrelator), the operation is simply a phase addition or rotation for each bin. This is the phase-rotation or phase-only approach.

Note that in the phase-only approach, the phase modification is not given by the piecewise-constant phase constructed in the design process, but by the phase of the filter that results from windowing; the windowing operation has a complicated effect on the original stair-step phase (of the decorrelation filter constructed using the subband building blocks). In one embodiment, the direct use of a piecewise-constant phase is used to achieve the decorrelation. Any resulting audible artifacts for some signals due to excessive time-domain aliasing are mitigated by the windowing process.

Figure 6:
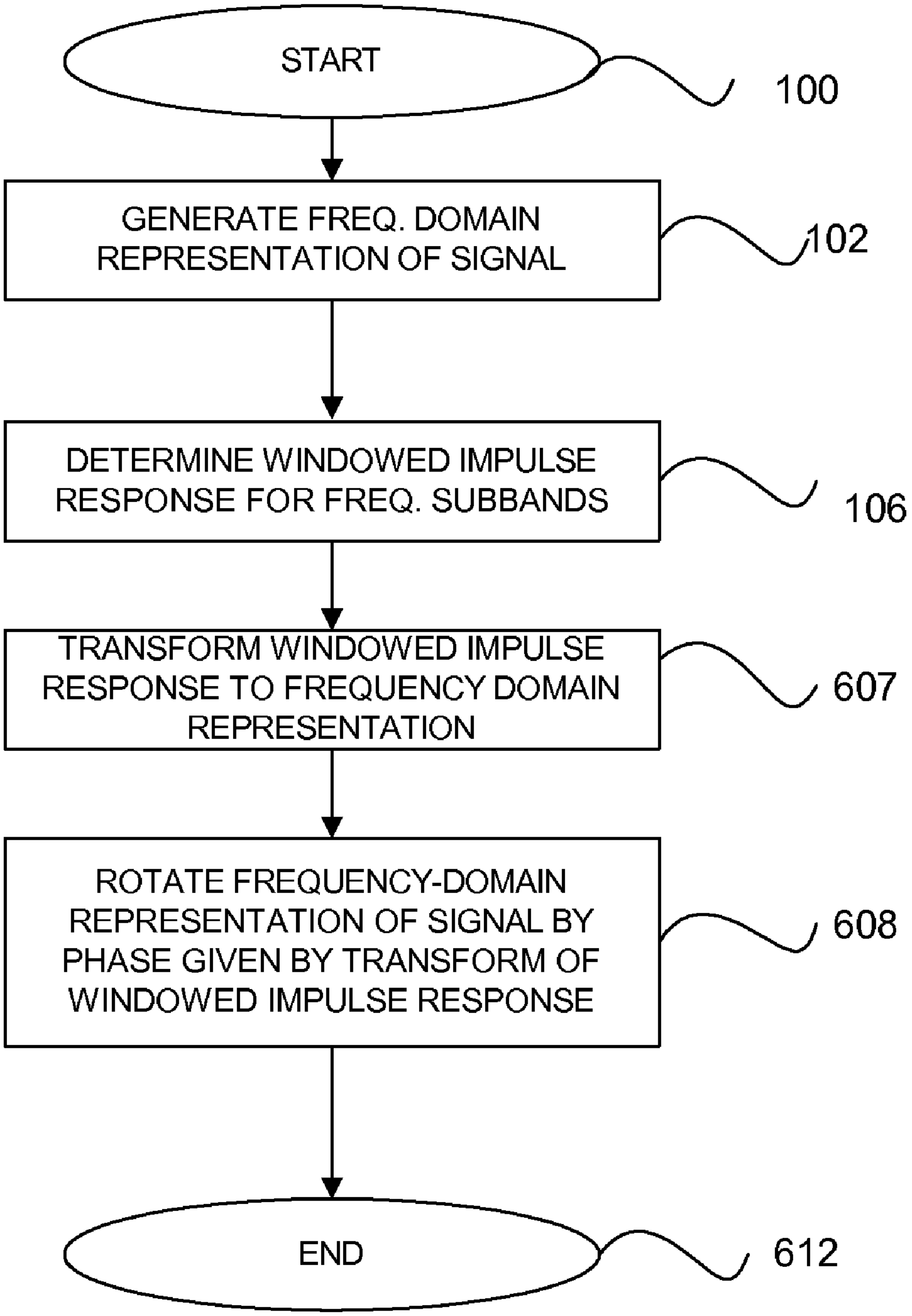
FIG. 6 is a flowchart illustrating a method of decorrelating a frequency-domain signal in accordance with a phase rotation embodiment of the present invention.

FIG. 6 is a flowchart illustrating a method of decorrelating a frequency-domain signal in accordance with a phase rotation embodiment of the present invention. The method commences at operation 100. Initially, at operation 102, a frequency-domain representation of the signal is generated. The frequency-domain representation may be generated by any method known in the art, including but not limited to the use of the Fast Fourier Transform (FFT), which is an efficient algorithm for computing the discrete Fourier transform (DFT). Next, at operation 106 the windowed impulse response of a time-domain decorrelator is determined. It should be noted that in some optional embodiments, the signal may first be decomposed into primary and ambient components before determination of a windowed impulse response.

At operation 607, the windowed impulse response is converted to a frequency-domain representation which comprises the phase and/or magnitude to be used in the subsequent complex operations. At operation 608, the frequency-domain representation of the signal (see operation 102) is rotated by the phase given by the transform of the windowed impulse response; a complex operation is carried out on each bin of the frequency-domain signal representation. The method concludes at operation 612.

Matlab Code to Generate the Phase Function

Provided below is exemplary Matlab code that can be used to create the frequency-dependent phase for the decorrelator. The phase increases linearly with the band number (with a sign change at each band), and the bandwidths also increase with the band number. This is somewhat arbitrary; there are a variety of possibilities for creating effective decorrelation phase curves. Those of skill in the art will understand that some experimentation is necessary to verify that the performance of a given design is satisfactory.

```
% This scripts generates an impulse response that can be used to decorrelate
% two signals in the frequency domain (it actually creates a phase response).
% The phase is constant within bands and the bandwidths increase from band to band.
N=2048*2;               % Target FFT size
SRate = 48000;          % Sample rate
LowerFreq = 250;        % Phase is 0 below this frequency
BandIncrease = 1.1;     % Each frequency band is larger than the previous one by BandIncrease
AlphaLinFact = .72;     % Linear term for Alpha as a function of the band number
InitialWidth = 50;      % Width in Hz of first band above LowerFreq
% Create frequency bands.
Bands = [0 LowerFreq];
CurFreq = LowerFreq;
CurWidth = InitialWidth;
for i=1:10000
    CurFreq = CurFreq+CurWidth;
    Bands=[Bands, CurFreq];
    if(CurFreq >= SRate/2)
        Bands(end) = SRate/2;
        break;
    end
    CurWidth = CurWidth * BandIncrease;
end
NumBands = length(Bands);
Bands = 1 + round(Bands / SRate * N);
Bands(1)=2; Bands(end)=N/2−1;
% Create array of phases.
phase = zeros(1,N/2−2);
Factor = 0;
for i=1:NumBands−1
    phase(Bands(i):Bands(i+1)) = pi * Factor * (−1)^i;
    Factor = Factor + AlphaLinFact;
end
ph = [0 phase 0 −fliplr(phase)];
% Compute frequency response and impulse response.
Xwindow = (exp(j*ph)).';
xwindow = ifft(Xwindow,N); plot(fftshift(xwindow))
% Apply window to time-limit the impulse response.
P=800;
h=hanning(2*P);
xwindow(1:P) = xwindow(1:P) .* h(P+1:2*P);
xwindow(N−P+1:N) = xwindow(N−P+1:N) .* h(1:P);
xwindow(P+1:N−P) = 0;
```

-continued

```
% Show the results.
figure(1); Xwindow = fft(xwindow); plot(db(Xwindow(1:end/2)))
semilogx((1:length(Xwindow)/2)*48000/N,db(Xwindow(1:end/2)));
grid on;
ph = angle(Xwindow); ph=ph(1:N/2);
figure(2); semilogx((1:length(ph))*48000/N,(ph)/pi); grid on;
ylabel('phase/pi');xlabel('Freq');
```

Several parameters must be selected to obtain an appropriate impulse response: the number of bands, the band edges, the phase values in each band, and the windowing function. Those of skill in the art will understand that selection of appropriate values for these parameters to achieve a desired performance can be achieved as a result of some minimal experimentation. There are a few noteworthy issues related to the selection of parameter values:

Phase offsets $\alpha_k$ at low frequencies: Selecting values of $\alpha_k$ that are close to $\pi$ at low frequencies can yield low-frequency signal cancellation between two speakers respectively used to broadcast a signal and its decorrelated version. In theory, this is not only a problem at low frequencies, but in practice low frequencies are particularly problematic because low-frequency sound waves are relatively unaffected by the acoustic environment, and will reach the listener's ears with an unmodified magnitude (which is not the case at higher frequencies). Furthermore, the decorrelation of low-frequency signal content may not be critical (from an auditory perception point of view) because in natural sound fields, low-frequency signals received at both ears are usually highly correlated. An appropriate frequency limit might be 200 Hz to 500 Hz; the values of $\alpha_k$ for subbands below 200 to 500 Hz should be kept close to 0 to avoid significant low-frequency losses. The Matlab code above implements this idea.

When creating more than one decorrelated copy of an original signal (for example, when upmixing from 2 to 7 channels, a total of four ambience signals must be synthesized to populate the two back and two side loudspeakers), it is necessary to use multiple arrays of $\alpha_k$ values (a different array for each copy), making sure the resulting signals are mutually decorrelated. As a counter-example, using the same array of $\alpha_k$ values to create the Left-Back and Left-Side channels from the Left-Front ambience channel would result in the same ambience signal being sent to the Left Back and Side speakers, clearly an undesirable result in that the resulting "stereo image" between those speakers would be narrow. Furthermore, the design should ensure that the left and right channels generated comprise a set of mutually decorrelated signals.

Signal decorrelation is useful in spatial audio enhancement algorithms. The invention embodiments provide a way to implement the decorrelation in the frequency domain. Since some core audio processing algorithms operate on frequency-domain signal representations, this approach provides a reduction in computational cost with respect to using a time-domain decorrelation method, and simplifies the processing architecture. It also improves the modularity of the processing; if all of the processing operations are carried out in the same signal domain, the modules can be more easily reordered to achieve various perceptual effects.

In embodiments of the present invention, decorrelation is achieved in the frequency domain. The implementation is straightforward and efficient. Method embodiments incorporate a consideration of the group delay of the corresponding filter, which results in an improved performance for spatial processing. Furthermore, it is straightforward to design a set of filters to generate a multiplicity of mutually decorrelated signals. With the traditional time-domain methods it can be difficult to carry out such a design.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for decorrelating a frequency-domain representation of a signal, the method comprising:

receiving an audio signal;

generating a frequency-domain representation of the signal;

determining an ideal frequency-domain decorrelating filter response;

determining a windowed time-domain impulse response from the ideal frequency-domain filter response;

determining a frequency-domain representation of the windowed time-domain impulse response;

determining a decorrelated signal by multiplying the frequency-domain representation of the signal by the frequency-domain representation of the windowed time-domain impulse response.

2. The method as recited in claim 1 wherein the ideal frequency-domain decorrelating filter response comprises a plurality of frequency sub bands, and a response of each frequency sub band is characterized by a fiat magnitude and a constant phase.

3. The method as recited in claim 2 wherein the bandwidth of the frequency subbands increases with increasing frequency.

4. The method as recited in claim 1 wherein the frequency-domain representation of the windowed time-domain impulse response is a phase-only representation.

5. A method for decorrelating a frequency-domain representation of a signal, the method comprising:

receiving an audio signal;

generating a frequency-domain representation of the signal;

determining a frequency-domain decorrelating filter response;

determining a windowed time-domain impulse response from the frequency-domain filter response; and determining a decorrelated signal from the frequency-domain representation using a phase rotation.

6. The method as recited in claim 5 wherein the frequency-domain representation includes a plurality of subbands and the phase rotation is applied to each of the plurality of subbands.

7. The method as recited in claim 5 wherein a different phase rotation is applied to each of the plurality of sub bands in the frequency-domain representation.

8. The method as recited in claim 7 wherein each subband comprises a plurality of frequency bins and the phase rotation is the same for all of the bins in each sub band.

9. An apparatus for decorrelating a frequency-domain representation of a signal, the apparatus comprising:

an interface configured to receive an audio signal; circuitry configured to generate a frequency-domain representation of the signal, determine an ideal frequency-domain decorrelating filter response, determine a windowed time-domain impulse response from the ideal frequency-domain filter response, and determine a frequency-domain representation of the windowed time-domain impulse response;

wherein a decorrelated signal is determined by multiplying the frequency-domain representation of the signal by the frequency-domain representation of the windowed time-domain impulse response.

10. The apparatus as recited in claim 9 wherein the ideal frequency-domain decorrelating filter response comprises a plurality of frequency sub bands, and a response of each frequency sub band is characterized by a fiat magnitude and a constant phase.

11. The apparatus as recited in claim 10 wherein a bandwidth of the frequency subbands increases with increasing frequency.

12. The apparatus as recited in claim 9 wherein the frequency-domain representation of the windowed time-domain impulse response is a phase-only representation.

* * * * *